US012578656B2

(12) United States Patent
Hoshino et al.

(10) Patent No.: US 12,578,656 B2
(45) Date of Patent: Mar. 17, 2026

(54) EUV LIGHT GENERATION APPARATUS AND ELECTRONIC DEVICE MANUFACTURING METHOD

(71) Applicant: GIGAPHOTON INC., Tochigi (JP)

(72) Inventors: Yusuke Hoshino, Tochigi (JP); Yukio Watanabe, Tochigi (JP)

(73) Assignee: GIGAPHOTON INC., Tochigi (JP)

( * ) Notice: Subject to any disclaimer, the term of this patent is extended or adjusted under 35 U.S.C. 154(b) by 200 days.

(21) Appl. No.: 18/322,131

(22) Filed: May 23, 2023

(65) Prior Publication Data

US 2024/0027920 A1     Jan. 25, 2024

(30) Foreign Application Priority Data

Jul. 20, 2022     (JP) ................................. 2022-115922

(51) Int. Cl.
    *G03F 7/20*         (2006.01)
    *G03F 7/00*         (2006.01)
    *H05G 2/00*         (2006.01)
(52) U.S. Cl.
    CPC ........ *G03F 7/7065* (2013.01); *G03F 7/70033* (2013.01); *G03F 7/70258* (2013.01); *H05G 2/002* (2024.08)
(58) Field of Classification Search
    CPC ............... G03F 7/7065; G03F 7/70033; G03F 7/70258; G03F 7/70841; H05G 2/003; H05G 2/008
    See application file for complete search history.

(56) References Cited

U.S. PATENT DOCUMENTS 6,289,077 B1 *   9/2001   Toyota ................ G03F 7/70841
                                                       378/34
8,669,542 B2     3/2014   Watanabe et al.
                          (Continued)

FOREIGN PATENT DOCUMENTS

JP         H0722118 B2 *   3/1995   ......... G03F 7/70058
JP         2004-214527 A   7/2004
JP         2019-129211 A   8/2019

OTHER PUBLICATIONS

Search Report mailed by the Netherlands Patent Office on Sep. 8, 2025, which corresponds to Dutch Patent Application No. 2035062, and is related to U.S. Appl. No. 18/322,131; with partial English translation.

*Primary Examiner* — Mesfin T Asfaw
(74) *Attorney, Agent, or Firm* — Studebaker Brackett PLLC

(57)                    ABSTRACT
An EUV light generation apparatus includes a chamber having internal pressure maintained below atmospheric pressure; a first bellows pipe having one end connected to the chamber; a first cover member which seals the other end under atmospheric pressure; a holder connected to the first cover member and arranged inside the chamber in a state of holding an optical element; a stage mechanism connected to the first cover member outside the chamber and configured to change at least either a position or an angle of the optical element with respect to the EUV light; a fixing member which fixes the stage mechanism to the chamber; and a cancellation mechanism which is connected to the holder to be movable in accordance with change of at least either the position or the angle, and transmits, to the holder, a second load opposite to a first load applied to the first cover member.

15 Claims, 14 Drawing Sheets

(56)        References Cited

U.S. PATENT DOCUMENTS

| | | | |
|---|---|---|---|
| 9,179,534 B2 | 11/2015 | Watanabe et al. | |
| 2008/0210889 A1 * | 9/2008 | Suganuma | G03F 7/70033 |
| | | | 250/504 R |
| 2012/0104290 A1 * | 5/2012 | Nishisaka | H05G 2/006 |
| | | | 315/111.21 |
| 2017/0212428 A1 | 7/2017 | Roos et al. | |
| 2022/0025950 A1 * | 1/2022 | Nishida | F16J 15/52 |

* cited by examiner

EUV LIGHT GENERATION APPARATUS AND ELECTRONIC DEVICE MANUFACTURING METHOD

CROSS-REFERENCE TO RELATED APPLICATIONS

The present application claims the benefit of Japanese Patent Application No. 2022-115922, filed on Jul. 20, 2022, the entire contents of which are hereby incorporated by reference.

BACKGROUND

1. Technical Field

The present disclosure relates to an EUV light generation apparatus, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target with laser light has been developed.

LIST OF DOCUMENTS

Patent Documents

Patent Document 1: U.S. Pat. No. 8,669,542
Patent Document 2: U.S. Pat. No. 9,179,534
Patent Document 3: Japanese Patent Application Publication No. 2019-129211
Patent Document 4: Japanese Patent Application Publication No. 2004-214527

SUMMARY

An EUV light generation apparatus according to an aspect of the present disclosure includes a chamber having internal pressure maintained below atmospheric pressure and being capable of generating EUV light; a first bellows pipe having one end thereof connected to the chamber to communicate with inside of the chamber; a first cover member which seals the other end of the first bellows pipe under atmospheric pressure; a holder connected to the first cover member and arranged inside the chamber in a state of holding an optical element on which the EUV light is to be incident; a stage mechanism connected to the first cover member outside the chamber and configured to change at least either a position or an angle of the optical element with respect to the EUV light; a fixing member which fixes the stage mechanism to the chamber; and a cancellation mechanism which is arranged at a position facing the first cover member via the holder, connected to the holder to be movable in accordance with change of at least either the position or the angle of the optical element, and transmits, to the holder, a second load in a direction opposite to a direction of a first load applied to the first cover member due to pressure difference between atmospheric pressure and pressure inside the chamber.

An electronic device manufacturing method according to an aspect of the present disclosure includes generating EUV light using an EUV light generation apparatus, outputting the EUV light to an exposure apparatus, and exposing a photosensitive substrate to the EUV light in the exposure apparatus to manufacture an electronic device. Here, the EUV light generation apparatus includes a chamber having internal pressure maintained below atmospheric pressure and being capable of generating the EUV light; a first bellows pipe having one end thereof connected to the chamber to communicate with inside of the chamber; a first cover member which seals the other end of the first bellows pipe under atmospheric pressure; a holder connected to the first cover member and arranged inside the chamber in a state of holding an optical element on which the EUV light is to be incident; a stage mechanism connected to the first cover member outside the chamber and configured to change at least either a position or an angle of the optical element with respect to the EUV light; a fixing member which fixes the stage mechanism to the chamber; and a cancellation mechanism which is arranged at a position facing the first cover member via the holder, connected to the holder to be movable in accordance with change of at least either the position or the angle of the optical element, and transmits, to the holder, a second load in a direction opposite to a direction of a first load applied to the first cover member due to pressure difference between atmospheric pressure and pressure inside the chamber.

An electronic device manufacturing method according to an aspect of the present disclosure includes inspecting a defect of a mask by irradiating the mask with EUV light generated using an EUV light generation apparatus, selecting a mask using a result of the inspection, and exposing and transferring a pattern formed on the selected mask onto a photosensitive substrate. Here, the EUV light generation apparatus includes a chamber having internal pressure maintained below atmospheric pressure and being capable of generating the EUV light; a first bellows pipe having one end thereof connected to the chamber to communicate with inside of the chamber; a first cover member which seals the other end of the first bellows pipe under atmospheric pressure; a holder connected to the first cover member and arranged inside the chamber in a state of holding an optical element on which the EUV light is to be incident; a stage mechanism connected to the first cover member outside the chamber and configured to change at least either a position or an angle of the optical element with respect to the EUV light; a fixing member which fixes the stage mechanism to the chamber, and a cancellation mechanism which is arranged at a position facing the first cover member via the holder, connected to the holder to be movable in accordance with change of at least either the position or the angle of the optical element, and transmits, to the holder, a second load in a direction opposite to a direction of a first load applied to the first cover member due to pressure difference between atmospheric pressure and pressure inside the chamber.

BRIEF DESCRIPTION OF THE DRAWINGS

Embodiments of the present disclosure will be described below merely as examples with reference to the accompanying drawings.

FIG. 3 is a diagram showing a first configuration example of an EUV light transmission system.

FIG. 6 is a diagram showing the configuration of the EUV light transmission system according to the first embodiment.

DESCRIPTION OF EMBODIMENTS

Figure 1:
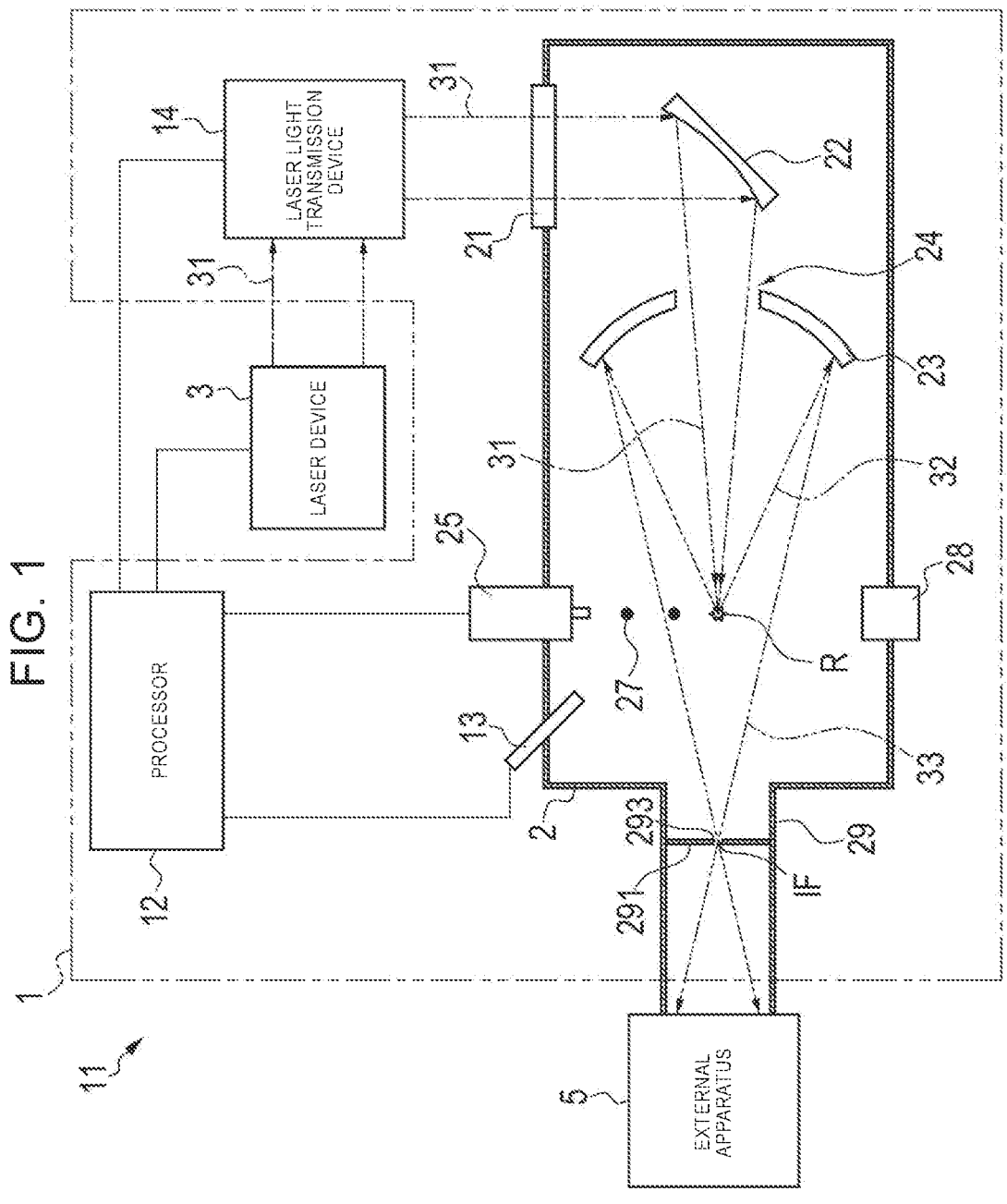
FIG. 1 is a diagram schematically showing the configuration of an LPP EUV light generation system.

<Contents>
1. Overall description of EUV light generation system
 1.1 Configuration
 1.2 Operation
2. EUV light generation system according to comparative example
 2.1 Configuration
 2.2 Operation
 2.3 EUV light transmission system
  2.3.1 First configuration example
  2.3.2 Problem
  2.3.3 Second configuration example
  2.3.4 Problem
3. EUV light generation system according to first embodiment
 3.1 Configuration
 3.2 Operation
 3.3 Effect
4. Modification of first embodiment
 4.1 First modification
  4.1.1 Configuration
  4.1.2 Operation
  4.1.3 Effect
 4.2 Second modification
  4.2.1 Configuration
  4.2.2 Operation
  4.2.3 Effect
 4.3 Third modification
  4.3.1 Configuration
  4.3.2 Operation
  4.3.3 Effect
 4.4 Fourth modification
  4.4.1 Configuration
  4.4.2 Operation
  4.4.3 Effect
 4.5 Fifth modification
 4.6 Other modification
5. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overall Description of EUV Light Generation System 1.1 Configuration

FIG. 1 schematically shows the configuration of an LPP EUV light generation system 11. An EUV light generation apparatus 1 is used together with a laser device 3. In the present disclosure, a system including the EUV light generation apparatus 1 and the laser device 3 is referred to as the EUV light generation system 11. The EUV light generation apparatus 1 includes a chamber 2 and a target supply device 25. The chamber 2 is a sealable container capable of generating EUV light 33. The target supply device 25 supplies a target 27 in a droplet form into the chamber 2. The material of the target 27 may include tin, terbium, gadolinium, lithium, xenon, or a combination of any two or more thereof.

A through hole is formed in a wall of the chamber 2. The through hole is blocked by a window 21 through which pulse laser light 31 output from the laser device 3 passes. An EUV light concentrating mirror 23 having a spheroidal reflection surface is arranged in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is arranged such that the first focal point is located in a plasma generation region R and the second focal point is located at an intermediate focal point IF. A through hole 24 is formed at the center of the EUV light concentrating mirror 23, and the pulse laser light 31 passes through the through hole 24.

The EUV light generation apparatus 1 includes a processor 12, a target sensor 13, and the like. The target sensor 13 detects at least one of the presence, trajectory, position, and velocity of the target 27. The target sensor 13 may have an imaging function.

Further, the EUV light generation apparatus 1 includes a connection pipe 29 providing communication between the inside of the chamber 2 and the inside of an external apparatus 5. A wall 291 in which an aperture 293 is formed is arranged in the connection pipe 29. The wall 291 is arranged such that the aperture 293 is located at the second focal point of the EUV light concentrating mirror 23. For example, the external apparatus 5 is an exposure apparatus.

Further, the EUV light generation apparatus 1 includes a laser light transmission device 14, a laser light concentrating optical system 22, and a target collection unit 28 for collecting the target 27. The laser light transmission device 14 includes an optical element for defining a transmission state of the laser light, and an actuator for adjusting the position, posture, and the like of the optical element.

1.2 Operation

Operation of an exemplary LPP EUV light generation system 11 will be described with reference to FIG. 1. The pulse laser light 31 output from the laser device 3 enters, via the laser light transmission device 14, the chamber 2 through the window 21. The pulse laser light 31 having entered the chamber 2 travels along a laser light path in the chamber 2, is concentrated by the laser light concentrating optical system 22, and is radiated to the target 27.

The target supply device 25 outputs the target 27 toward the plasma generation region R in the chamber 2. The target 27 is irradiated with the pulse laser light 31. The target 27 irradiated with the pulse laser light 31 is turned into plasma, and radiation light 32 is radiated from the plasma. The EUV light 33 contained in the radiation light 32 is selectively reflected by the EUV light concentrating mirror 23. The EUV light 33 reflected by the EUV light concentrating mirror 23 is concentrated at the intermediate focal point IF and output to the external apparatus 5. Here, one target 27 may be irradiated with a plurality of pulses included in the pulse laser light 31.

The processor 12 controls the entire EUV light generation system 11. Based on the detection result of the target sensor 13, the processor 12 controls timing at which the target 27 is output, an output direction of the target 27, and the like. Further, the processor 12 controls oscillation timing of the laser device 3, the travel direction of the pulse laser light 31, the concentration position, and the like. The above-described various kinds of control are merely examples, and other control may be added as necessary.

Figure 2:
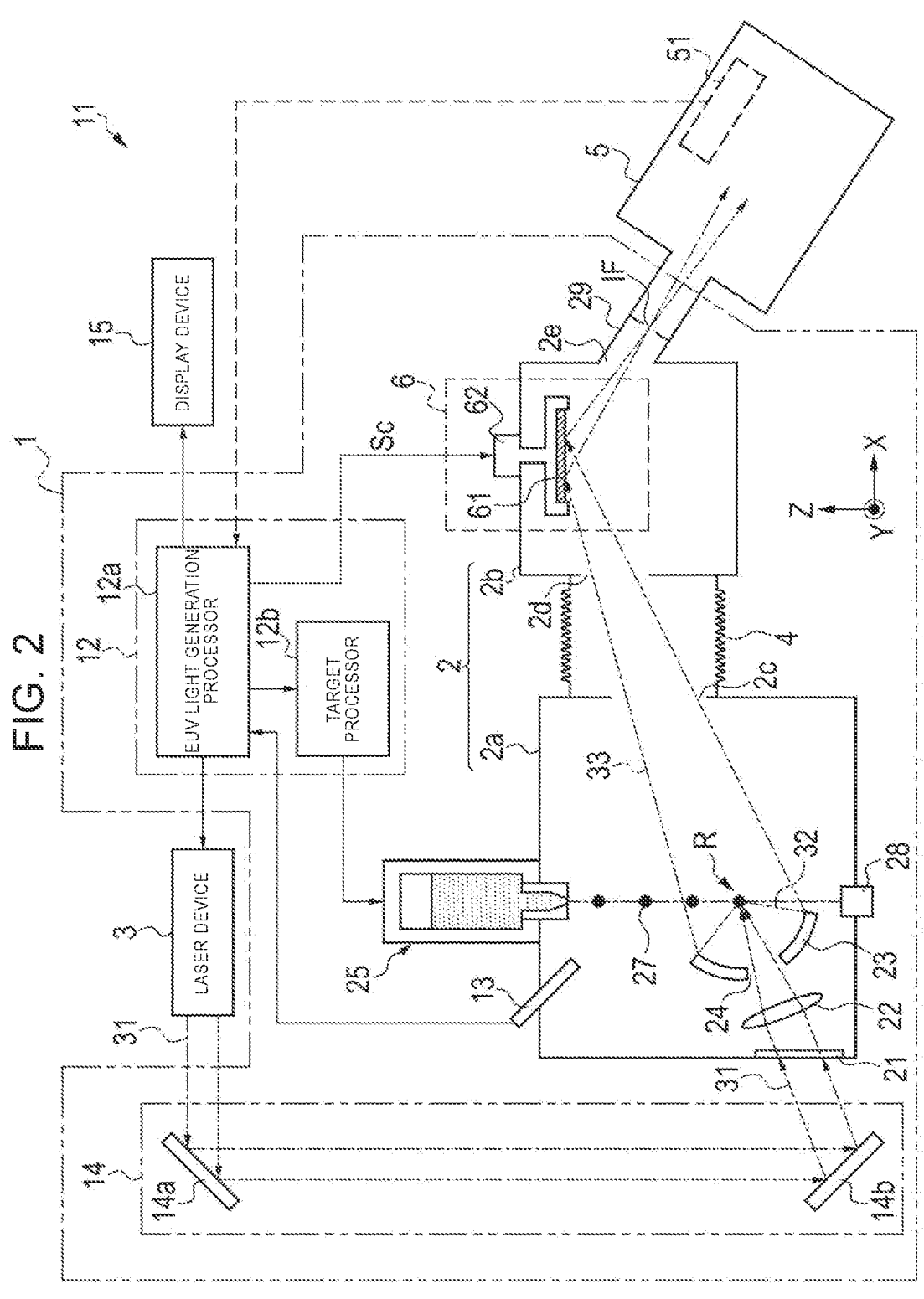
FIG. 2 is a diagram showing the configuration of the EUV light generation system according to a comparative example.

2. EUV Light Generation System According to Comparative Example 2.1 Configuration FIG. 2 schematically shows the configuration of the EUV light generation system 11 according to a comparative example. In the comparative example, the processor 12 includes an EUV light generation processor 12a and a target processor 12b. The EUV light generation processor 12a controls the laser device 3, the target processor 12b, and the like. The target processor 12b controls the target supply device 25. Each of the EUV light generation processor 12a and the target processor 12b may be configured by a computer that is a combination of hardware and software.

The EUV light generation system 11 according to the comparative example includes a display device 15. The EUV light generation processor 12a controls the display device 15 to display information and the like notified from the external apparatus 5.

The laser light transmission device 14 includes high reflection mirrors 14a, 14b for reflecting the pulse laser light 31 output from the laser device 3 and guiding the pulse laser light 31 to the window 21 of the chamber 2.

The chamber 2 includes an EUV light generation chamber 2a and an EUV light transmission chamber 2b. The EUV light generation chamber 2a is a chamber for generating the EUV light 33. The EUV light transmission chamber 2b is a chamber for transmitting the EUV light 33 generated in the EUV light generation chamber 2a toward the external apparatus 5.

The EUV light generation chamber 2a is provided with the window 21, the laser light concentrating optical system 22, the EUV light concentrating mirror 23, the target supply device 25, the target collection unit 28, and the target sensor 13. The EUV light generation chamber 2a is connected to the EUV light transmission chamber 2b via a bellows pipe 4.

The bellows pipe 4 connects an opening 2c of the EUV light generation chamber 2a arranged at the position where the EUV light 33 is output and an inlet 2d of the EUV light transmission chamber 2b. The bellows pipe 4 is arranged so as to surround the optical path of the EUV light 33.

The inside of each of the EUV light generation chamber 2a, the EUV light transmission chamber 2b, and the bellows pipe 4 is maintained in hydrogen atmosphere having pressure below the atmospheric pressure.

The above-described connection pipe 29 is connected to an outlet 2e of the EUV light transmission chamber 2b. The EUV light transmission chamber 2b is connected to the external apparatus 5 via the connection pipe 29.

The EUV light transmission system 6 is arranged in the EUV light transmission chamber 2b. The EUV light transmission system 6 includes a mirror 61 that reflects the EUV light 33, and a stage mechanism 62 that moves the mirror 61. The mirror 61 is arranged in the EUV light transmission chamber 2b at a position where the EUV light 33 enters through the inlet 2d from the bellows pipe 4. For example, the mirror 61 is a planar mirror having a planar reflection surface.

The stage mechanism 62 is connected to the mirror 61, and changes at least one of the position and the angle of the mirror 61 with respect to the EUV light 33. The EUV light transmission system 6 controls the transmission direction of the EUV light 33 based on a control signal Sc transmitted from the EUV light generation processor 12a.

The external apparatus 5 includes a processor 51. The processor 51 detects the state of the EUV light 33 transmitted from the EUV light transmission chamber 2b via the connection pipe 29, and transmits the detection result to the EUV light generation processor 12b. The state of the EUV light 33 includes the position of the intermediate focal point IF, the incident angle of the EUV light 33 on the intermediate focal point IF, and the like.

2.2 Operation

The operation of the EUV light generation system 11 according to the comparative example will be described. First, the inside of each of the EUV light generation chamber 2a, the EUV light transmission chamber 2b, and the bellows pipe 4 becomes into hydrogen atmosphere. Due to the control of the target processor 12b, the target 27 in the form of a droplet is output from the target supply device 25 toward the plasma generation region R in the EUV light generation chamber 2a.

Due to the control of the EUV light generation processor 12a, the EUV light 33 is generated by irradiating the target 27 with the pulse laser light 31 output from the laser device 3 at the timing at which the target 27 reaches the plasma generation region R.

Part of the EUV light 33 generated in the plasma generation region R is reflected by the EUV light concentrating mirror 23 and enters the EUV light transmission chamber 2b via the bellows pipe 4. The EUV light 33 having entered the EUV light transmission chamber 2b is reflected by the mirror 61 of the EUV light transmission system 6, concentrated at the intermediate focal point IF in the connection pipe 29, and output to the external apparatus 5.

The processor 51 of the external apparatus 5 transmits, to the EUV light generation processor 12a, an instruction signal for starting and stopping the generation of the EUV light 33 and a detection result as detecting the state of the EUV light 33. The EUV light generation processor 12a displays the detection result on the display device 15, and controls the EUV light transmission system 6 based on the detection result so that the EUV light 33 passes through the intermediate focal point IF in a desired state.

2.3 EUV Light Transmission System 2.3.1 First Configuration Example

Figure 3:
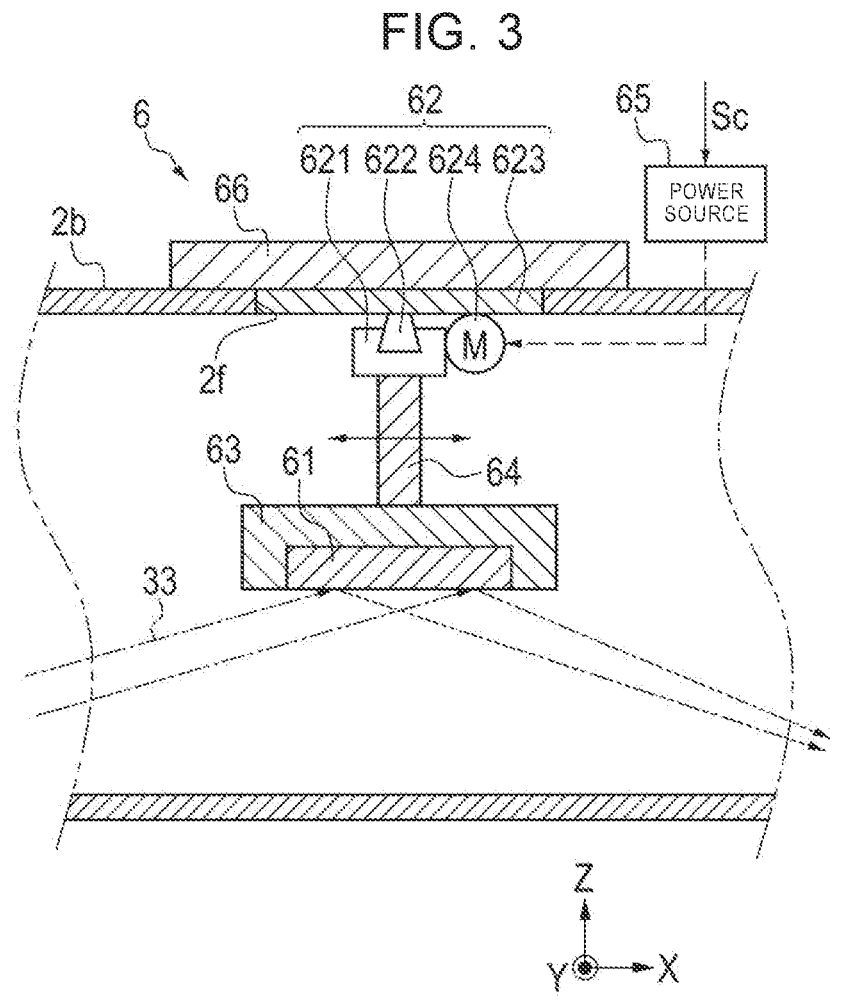

FIG. 3 shows a first configuration example of the EUV light transmission system 6. The mirror 61 is held by a mirror holder 63. The mirror holder 63 is held by a support column 64. The mirror holder 63 holds the mirror 61 such that the reflection surface of the mirror 61 is parallel to the X direction and the Y direction. The support column 64 is connected to the center of the mirror holder 63 and extends in the Z direction. Here, the X direction, the Y direction, and the Z direction are directions orthogonal to each other.

The stage mechanism 62 is a two-axis XY stage that enables the mirror holder 63 to move in the X direction and the Y direction. The stage mechanism 62 includes a rail guide 621, a rail 622, a stage holding portion 623, and a motor 624.

The rail guide 621 is connected to the support column 64 and has a groove extending in the Y direction. The rail 622 is slidably fitted in the groove. The rail guide 621 includes another rail guide (not shown) fixed to the rail 622 and formed with a groove extending in the X direction. Another rail (not shown) is slidably fitted in the groove of the other rail guide.

The stage holding portion 623 holds the rail 622. The motor 624 is arranged at the stage holding portion 623, and drives the rail guide 621 in the X direction and the Y direction. Energy is supplied to the motor 624 from a power supply 65 arranged outside the EUV light transmission chamber 2b. The energy supplied from the power supply 65 to the motor 624 is controlled by the control signal Sc transmitted from the EUV light generation processor 12a.

The stage holding portion 623 is arranged at an installation port 2f formed in the EUV light transmission chamber 2b and fixed to the EUV light transmission chamber 2b by a fixing member 66. The fixing member 66 includes a flange portion, and the flange portion is fixed to the EUV light transmission chamber 2b by using a bolt (not shown). The stage mechanism 62 is arranged in the EUV light transmission chamber 2b.

2.3.2 Problem

In the EUV light transmission system 6 according to the first configuration example, the stage mechanism 62 is in hydrogen atmosphere as being arranged in the EUV light transmission chamber 2b. Therefore, a general-purpose stage cannot be used as the stage mechanism 62, and a custom-made stage is required to be used. However, few types of stages that are guaranteed to be driven in hydrogen atmosphere are available and are expensive. Therefore, the EUV light transmission system 6 according to the first configuration example has a problem in terms of the manufacturing cost.

2.3.3 Second Configuration Example

Figure 4:
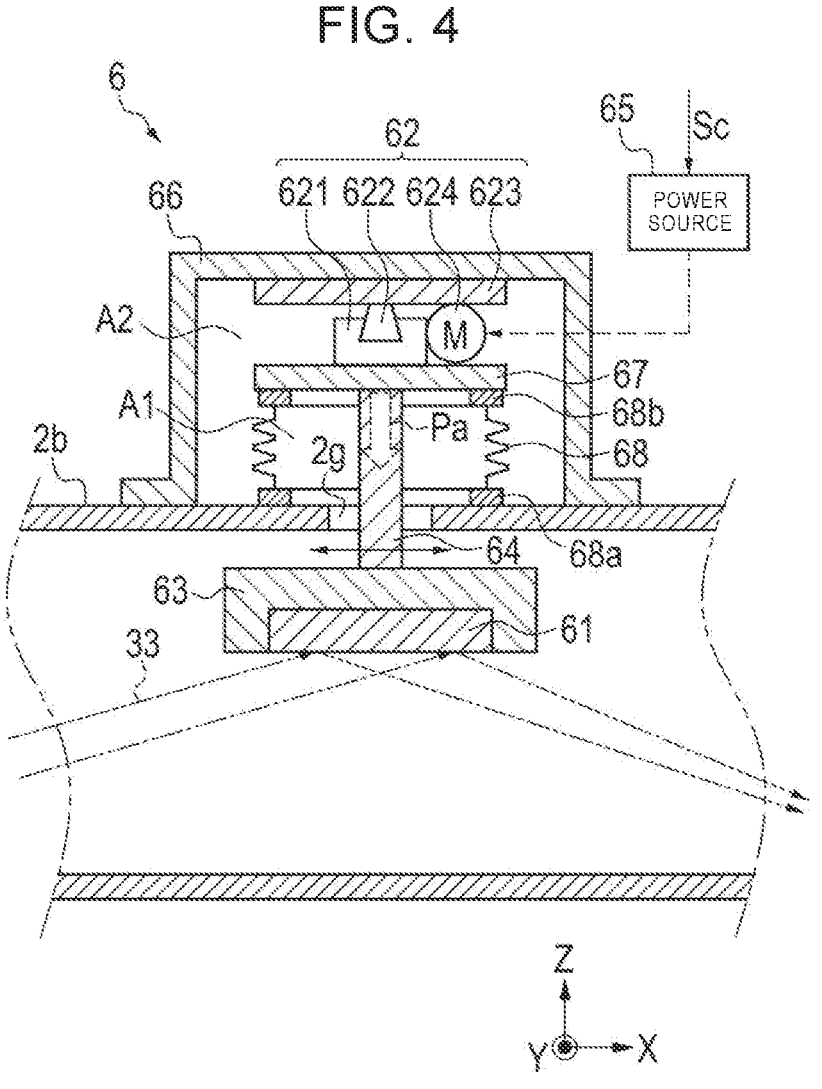
FIG. 4 is a diagram showing a second configuration example of the EUV optical transmission system.

FIG. 4 shows a second configuration example of the EUV light transmission system 6. The EUV light transmission system 6 according to the second configuration example differs from the EUV light transmission system 6 according to the first configuration example in that the stage mechanism 62 is arranged outside the EUV light transmission chamber 2b. In the EUV light transmission system 6 according to the second configuration example, the mirror holder 63 includes a cover member 67 and a bellows pipe 68 in addition to the support column 64 and the stage mechanism 62.

In the EUV light transmission chamber 2b, a drive port 2g is formed in place of the installation port 2f shown in FIG.

3. The support column 64 is inserted through the drive port 2g. The diameter of the drive port 2g is larger than the diameter of the support column 64, and the support column 64 is movable in the X direction and the Y direction. One end of the support column 64 is connected to the mirror holder 63, and the other end thereof is connected to the cover member 67.

On the outer surface of the EUV light transmission chamber 2b, a ring-shaped bellows fixing member 68a is arranged around the drive port 2g so as to surround the drive port 2g. The cover member 67 is provided with a ring-shaped bellows fixing member 68b at a position facing the bellows fixing member 68a.

The bellows pipe 68 is arranged on the outer side of the EUV light transmission chamber 2b so as to surround the drive port 2g. One end of the bellows pipe 68 is connected to the EUV light transmission chamber 2b via the bellows fixing member 68a, and the other end thereof is connected to the cover member 67 via the bellows fixing member 68b. The cover member 67 is a seal cover that seals the opening at the other end of the bellows pipe 68 under the atmospheric pressure. For example, the bellows pipe 68 is a cylindrical pipe deformable in the X direction, the Y direction, and the Z direction, and has stretchability and flexibility.

A portion of the support column 64 located on the outer side of the EUV light transmission chamber 2b is arranged in a space A1 surrounded by the bellows pipe 68 and the cover member 67. Hereinafter, the space A1 is referred to as a bellows space A1. The bellows space A1 communicates with the inside of the EUV light transmission chamber 2b through the drive port 2g and is maintained in hydrogen atmosphere below the atmospheric pressure.

The above-described stage mechanism 62 is arranged on a surface of the cover member 67 opposite to the bellows pipe 68. The rail guide 621 is connected to the cover member 67, and the stage holding portion 623 is connected to the fixing member 66. The fixing member 66 surrounds the stage mechanism 62, the bellows pipe 68, and the cover member 67 by the upper surface and side surface thereof. The fixing member 66 is fixed to the EUV light transmission chamber 2b via a flange portion.

As described above, in the second configuration example, the stage mechanism 62 is arranged outside the EUV light transmission chamber 2b and in a space A2 surrounded by the fixing member 66, the bellows pipe 68, and the cover member 67. Hereinafter, the space A2 is referred to as a fixing member space A2. The fixing member space A2 is in the atmospheric pressure environment.

2.3.4 Problem

In the second configuration example, since the stage mechanism 62 is arranged in the fixing member space A2 in the atmospheric pressure environment, there is no need to use an expensive stage, as the stage mechanism 62, that is guaranteed to be driven in hydrogen atmosphere as in the first configuration example.

However, since the pressure in the fixing member space A2 is the atmospheric pressure while the pressure in the bellows space A1 is less than the atmospheric pressure, a load Pa is applied to the cover member 67 due to the pressure difference. This load Pa acts on the stage mechanism 62 in the −Z direction. Further, a load corresponding to the total weight of the support column 64, the mirror holder 63, and the mirror 61 fixed via the cover member 67 is applied to the stage mechanism 62. When the stage mechanism 62 is driven under such loads, the stage mechanism 62 may be damaged or the accuracy of the drive control may be reduced.

Since the stage capable of dealing with such loads is expensive and large, it is difficult to adopt such a stage as the stage mechanism 62.

3. EUV Light Generation System According to First Embodiment

The EUV light generation system 11 according to a first embodiment will be described. Any component same as that described above is denoted by an identical reference sign, and duplicate description thereof is omitted unless specific description is needed.

3.1 Configuration

Figure 5:
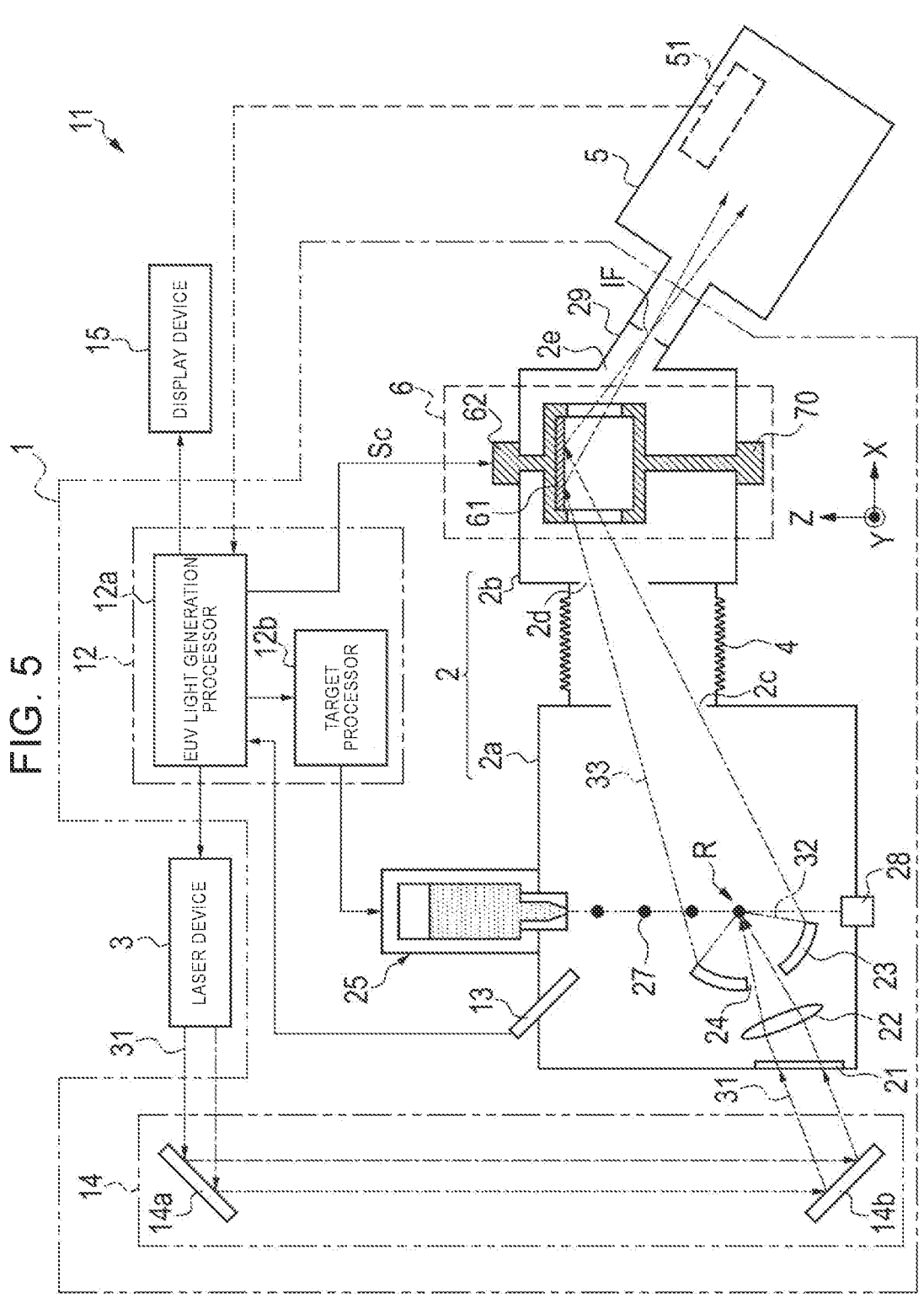
FIG. 5 is a diagram showing the configuration of the EUV light generation system according to a first embodiment.

FIG. 5 shows the configuration of the EUV light generation system 11 according to the first embodiment. The EUV light generation system 11 according to the present embodiment differs from the EUV light generation system 11 according to the comparative example only in the configuration of the EUV light transmission system 6. In the present embodiment, the EUV light transmission system 6 includes, in addition to the mirror 61 and the stage mechanism 62, a cancellation mechanism 70 for canceling the load Pa applied to the cover member 67.

Figure 6:
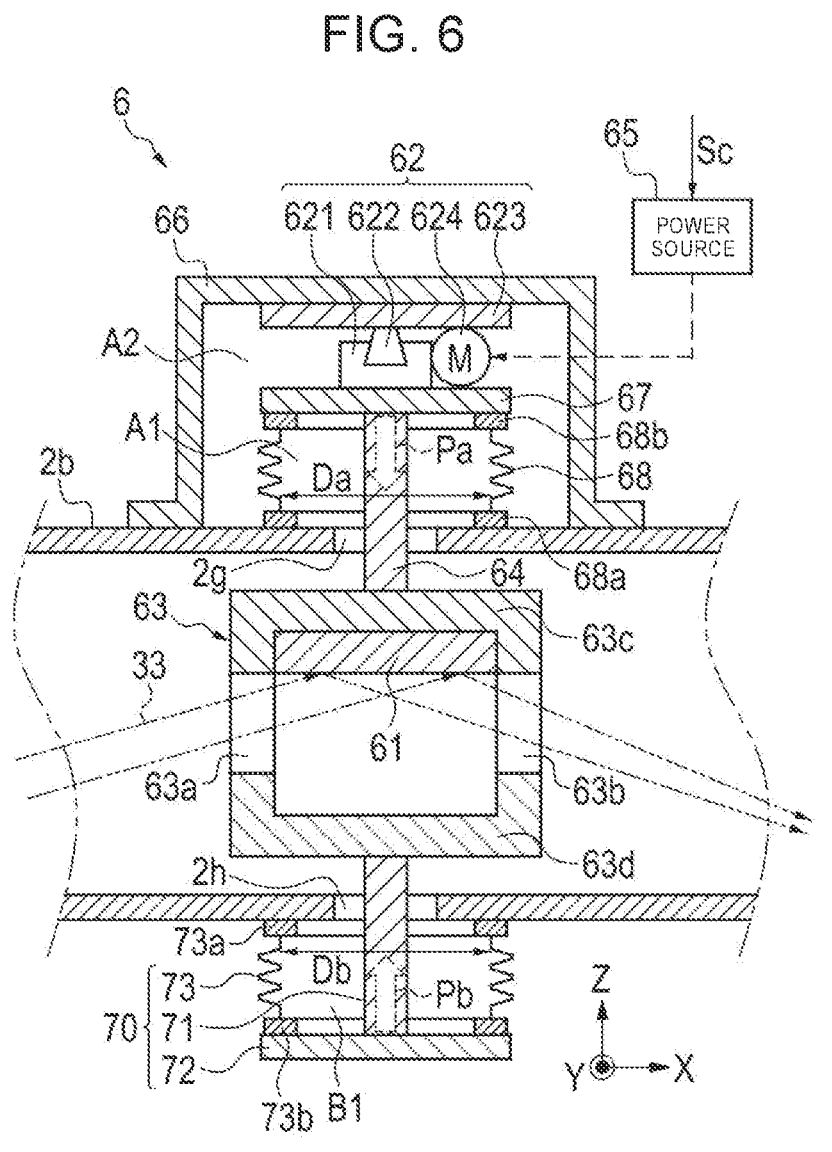

FIG. 6 shows the configuration of the EUV light transmission system 6 according to the first embodiment. The cancellation mechanism 70 is arranged at a position facing the cover member 67 via the mirror holder 63. Specifically, the cancellation mechanism 70 is arranged on the wall of EUV light transmission chamber 2b on the side in the −Z direction, which is the direction of the load Pa applied to the cover member 67, and connected to the mirror holder 63 to be movable in accordance with positional change of the mirror 61.

The cancellation mechanism 70 includes a support column 71, a cover member 72, and a bellows pipe 73. The support column 71 is inserted through a drive port 2h. The diameter of the drive port 2h is larger than the diameter of the support column 71, and the support column 71 is movable in the X direction and the Y direction. One end of the support column 71 is connected to the mirror holder 63, and the other end thereof is connected to the cover member 72. The support column 71 extends in the Z direction. The support column 71 and the support column 64 are arranged coaxially.

On the outer surface of the EUV light transmission chamber 2b, a ring-shaped bellows fixing member 73a is arranged around the drive port 2h so as to surround the drive port 2h. The cover member 72 is provided with a ring-shaped bellows fixing member 73b at a position facing the bellows fixing member 73a.

The bellows pipe 73 is arranged on the outer side of the EUV light transmission chamber 2b so as to surround the drive port 2h. One end of the bellows pipe 73 is connected to the EUV light transmission chamber 2b via the bellows fixing member 73a, and the other end thereof is connected to the cover member 72 via the bellows fixing member 73b. The cover member 72 is a seal cover that seals the opening at the other end of the bellows pipe 73 under the atmospheric pressure. For example, the bellows pipe 73 is a cylindrical pipe deformable in the X direction, the Y direction, and the Z direction, and has stretchability and flexibility.

The shape and size of the bellows pipe 68 and the bellows pipe 73 are selected so that the bellows pipe 68 and the bellows pipe 73 have the same area in the XY plane. An inner diameter Da of the bellows pipe 68 is equal to an inner diameter db of the bellows pipe 73. That is, the cover member 67 and the cover member 72 have the same area respectively on the sides facing the inside of the EUV light transmission chamber 2b.

A portion of the support column 71 located on the outer side of the EUV light transmission chamber 2b is arranged in a space B1 surrounded by the bellows pipe 73 and the cover member 72. Hereinafter, the space B1 is referred to as a bellows space B1. The bellows space B1 communicates with the inside of the EUV light transmission chamber 2b through the drive port 2h and is maintained in hydrogen atmosphere below the atmospheric pressure.

In the present embodiment, the mirror holder 63 is a box-shaped member in which a first opening 63a and a second opening 63b are formed, and the mirror 61 is arranged inside the mirror holder 63. The EUV light 33 is incident on the mirror 61 through the first opening 63a. The EUV light 33 reflected by the mirror 61 is output toward the intermediate focal point IF through the second opening 63b.

The support column 64 is connected to an upper portion 63c of the mirror holder 63. The support column 71 is connected to a lower portion 63d of the mirror holder 63. The mirror 61 is arranged at the upper portion 63c of the mirror holder 63 on the side of the inner surface.

The support column 71, the cover member 72, and the bellows pipe 73 have similar configurations to the support column 64, the cover member 67, and the bellows pipe 68, respectively.

The support column 64 corresponds to the "first support column" according to the present disclosure. The cover member 67 corresponds to the "first cover member" according to the present disclosure. The bellows pipe 68 corresponds to the "first bellows pipe" according to the present disclosure. The support column 71 corresponds to the "second support column" according to the present disclosure. The cover member 72 corresponds to the "second cover member" according to the present disclosure. The bellows pipe 73 corresponds to the "second bellows pipe" according to the present disclosure.

3.2 Operation

Next, operation of the EUV light transmission system 6 according to the first embodiment will be described. When the inside of the EUV light transmission chamber 2b and the bellows spaces A1, B1 communicating therewith become below the atmospheric pressure, the cover member 67 receives the load Pa in the −Z direction, and the cover member 72 of the cancellation mechanism 70 receives a load Pb in the +Z direction. The load Pa propagates via the support column 64 to the mirror holder 63, and the load Pb propagates via the support column 71 to the mirror holder 63. The load Pa corresponds to the "first load" according to the present disclosure. The load Pb corresponds to the "second load" according to the present disclosure.

Since the areas of the bellows spaces A1, B1 in the XY plane are equal to each other, the load Pa and the load Pb are equal in magnitude and opposite in direction. Thus, the load Pa applied to the cover member 67 is canceled by the load Pb generated by the cancellation mechanism 70.

Figure 7:
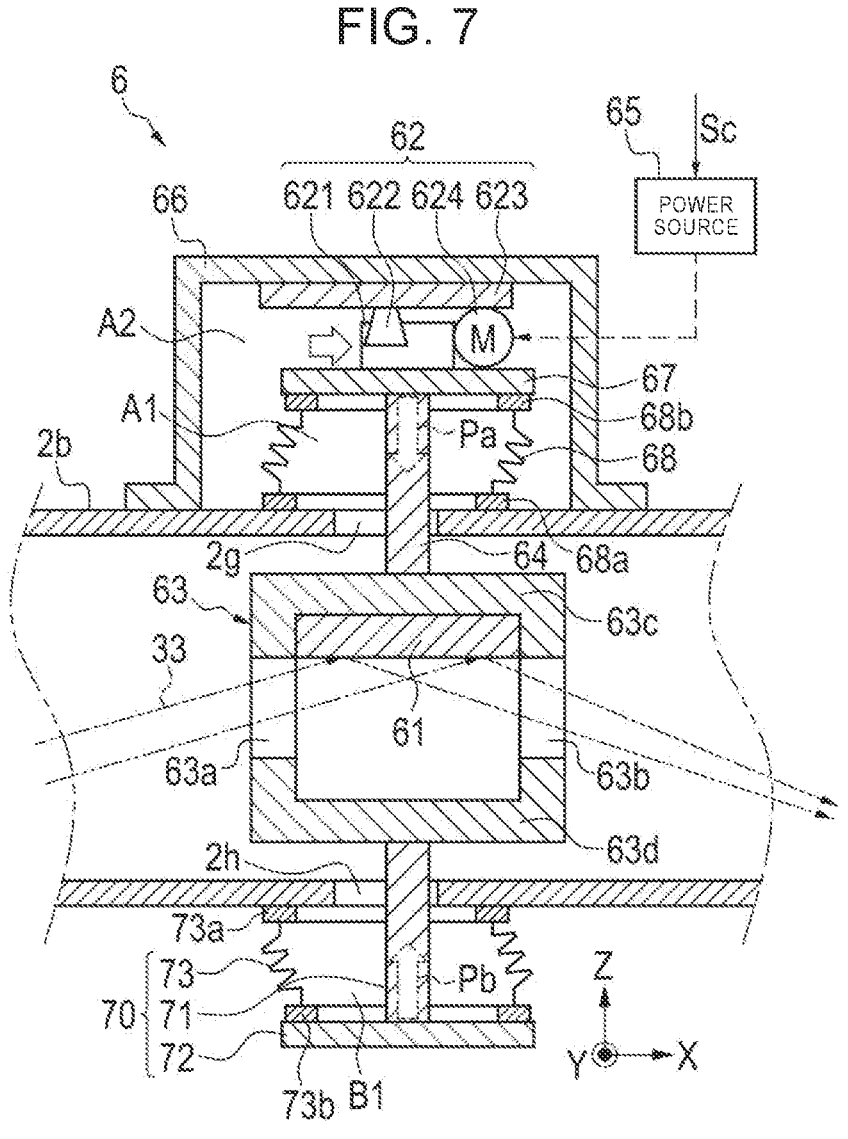
FIG. 7 is a diagram showing a state in which a cover member is moved by driving a stage mechanism.

FIG. 7 shows a state in which the cover member 67 is moved by driving the stage mechanism 62. The stage mechanism 62 moves the cover member 67 in a direction perpendicular to the direction of the load Pa. When the cover member 67 moves, the cancellation mechanism 70 moves together with the mirror holder 63. As described above, even when the cover member 67 and the cancellation mechanism 70 are moved, the load Pa and the load Pb are canceled as being equal in magnitude and opposite in direction.

3.3 Effect

Since the load Pa is canceled by the load Pb as described above, the load Pa applied to the cover member 67 due to the pressure difference between the bellows space A1 and the fixing member space A2 becomes theoretically zero. Accordingly, the type of the stage to be used as the stage mechanism 62 can be selected in consideration of only the total weight of the support column 64, the mirror holder 63, and the mirror 61. As a result, an inexpensive and compact stage can be adopted as compared with the second configuration example in the comparative example.

4. Modification of First Embodiment

The EUV light transmission system 6 according to the first embodiment can be modified in various ways. Hereinafter, modifications of the EUV light transmission system 6 will be described.

4.1 First Modification 4.1.1 Configuration

Figure 8:
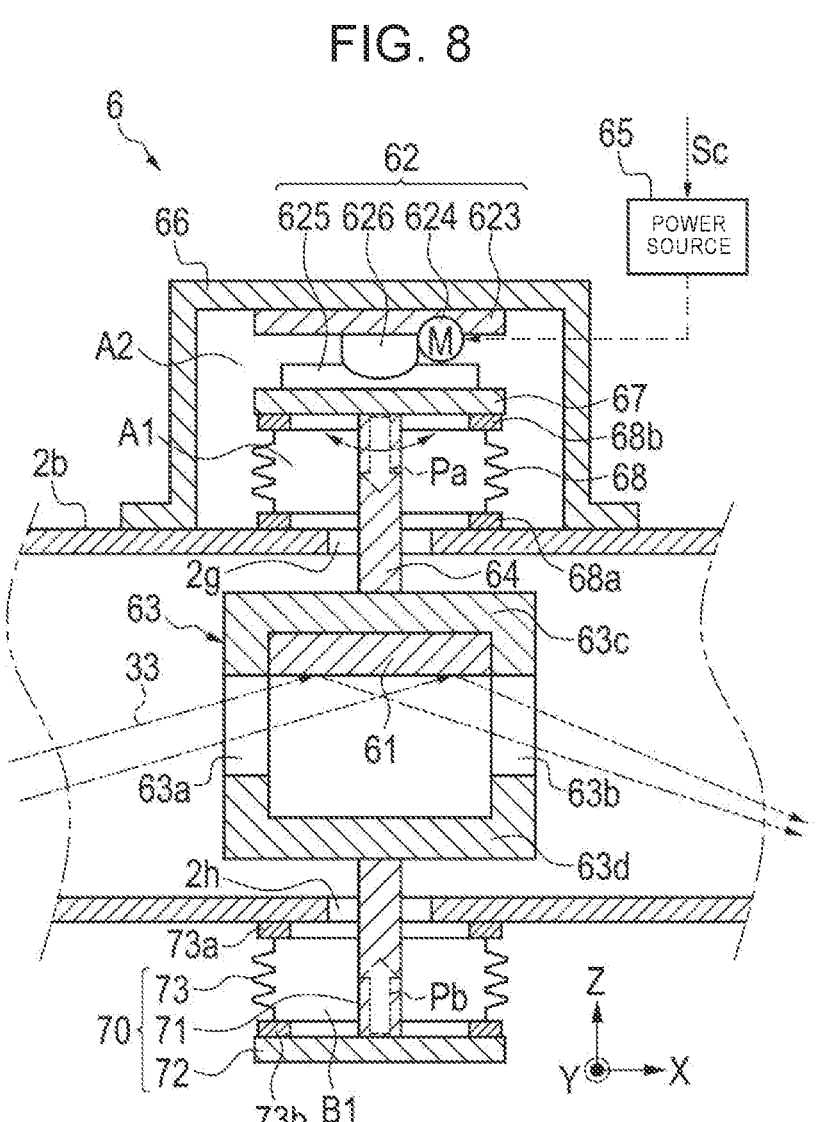
FIG. 8 is a diagram showing the configuration of the EUV light transmission system according to a first modification.

FIG. 8 shows the configuration of the EUV light transmission system 6 according to a first modification. The EUV light transmission system 6 according to the present modification differs from the EUV light transmission system 6 according to the first embodiment only in the configuration of the stage mechanism 62. In the present modification, the stage mechanism 62 is a tilt stage that tilts the cover member 67. The tilt stage is, for example, a two-axis goniometer stage.

The stage mechanism 62 of the present modification includes a swing guide 625, a swing portion 626, a stage holding portion 623, and a motor 624. The swing guide 625 is fixed to the cover member 67, and the swing portion 626 is fixed to the stage holding portion 623. The swing portion 626 is formed with a convex curved surface curved in the X direction, the Y direction, and the Z direction. The swing guide 625 is formed with a concave surface that causes the swing portion 626 to slide with the curved surface of the swing portion 626 being in contact thereto. The motor 624 is fixed to the swing portion 626 and drives the swing guide 625.

4.1.2 Operation

In the present modification, the stage mechanism 62 tilts the cover member 67 by swinging the swing portion 626 based on the control signal Sc transmitted from the EUV light generation processor 12a. Accordingly, the mirror 61 is tilted, and the state of the EUV light 33 is changed.

Even when the cover member 67 is tilted by the stage mechanism 62, the load Pa and the load Pb are canceled as being equal in magnitude and opposite in direction.

4.1.3 Effect

Even when the cover member 67 is tilted, the load Pa is canceled by the load Pb, and therefore, as in the first embodiment, an inexpensive and compact stage can be adopted as the stage mechanism 62.

4.2 Second Modification 4.2.1 Configuration

Figure 9:
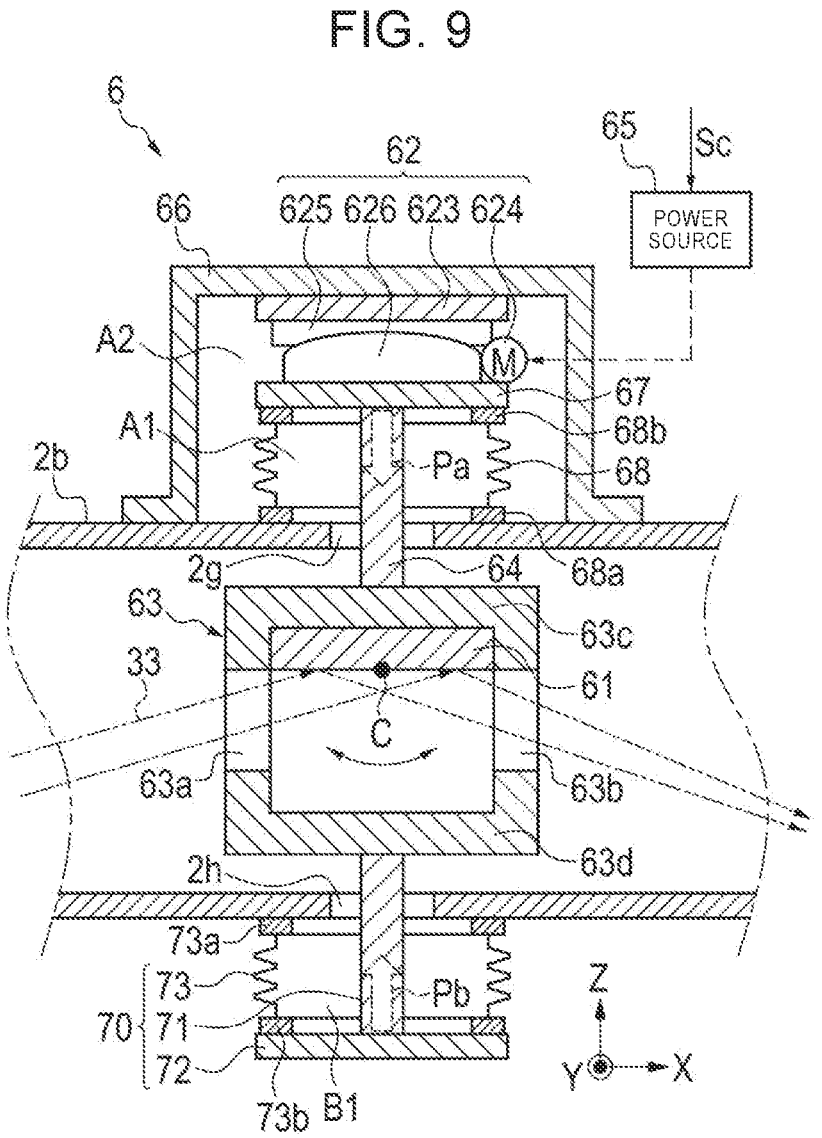
FIG. 9 is a diagram showing the configuration of the EUV light transmission system according to a second modification.

FIG. 9 shows the configuration of the EUV light transmission system 6 according to a second modification. The EUV light transmission system 6 according to the present modification differs from the EUV light transmission system 6 according to the first embodiment only in the configuration of the stage mechanism 62. In the present modification, the stage mechanism 62 is a tilt stage that tilts the cover member 67 as in the first modification. The tilt stage is, for example, a two-axis goniometer stage.

Similarly to the first modification, the stage mechanism 62 includes the swing guide 625, the swing portion 626, the stage holding portion 623, and the motor 624. In the present modification, the swing guide 625 is fixed to the stage holding portion 623, and the swing portion 626 is fixed to the cover member 67. The swing guide 625 and the swing portion 626 have a similar configuration to the swing guide 625 and the swing portion 626 of the first modification. The stage mechanism 62 of the present modification tilts the cover member 67 with the rotation center C located on the reflection surface of the mirror 61 as a rotation axis. The "reflection surface of the mirror 61" is an example of the "surface of the optical element" according to the present disclosure.

4.2.2 Operation

In the present modification, the stage mechanism 62 tilts the cover member 67 by swinging the swing portion 626 based on the control signal Sc transmitted from the EUV light generation processor 12a. Accordingly, the mirror 61 is tilted with the rotation center C as the rotation axis.

As in the first modification, even when the cover member 67 is tilted, the load Pa and the load Pb are canceled as being equal in magnitude and opposite in direction.

4.2.3 Effect

Even when the cover member 67 is tilted by the stage mechanism 62, the load Pa is canceled by the load Pb, and therefore, as in the first embodiment, an inexpensive and compact stage can be adopted as the stage mechanism 62. Further, in the present modification, since the mirror 61 is tilted about the rotation center C, there is an advantage that the amount of change in the posture of the mirror 61 due to the tilt of the cover member 67 is small.

4.3 Third Modification 4.3.1 Configuration

Figure 10:
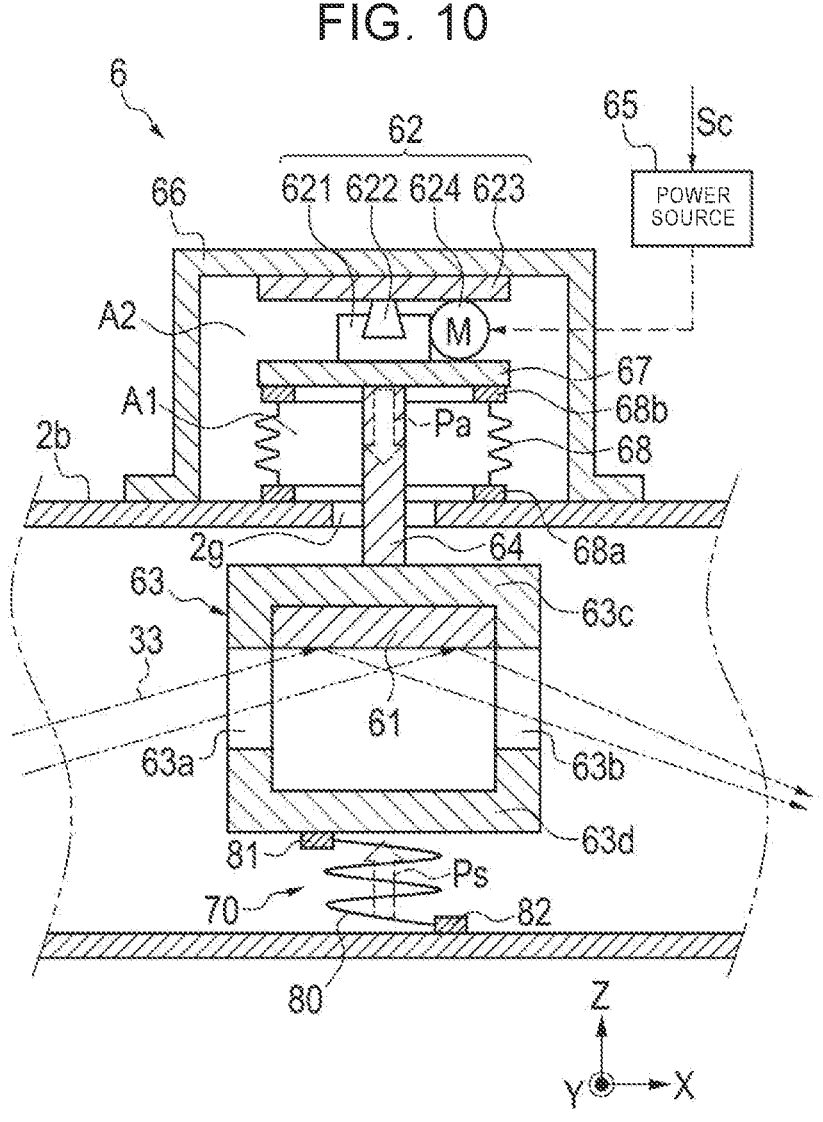
FIG. 10 is a diagram showing the configuration of the EUV light transmission system according to a third modification.

FIG. 10 shows the configuration of the EUV light transmission system 6 according to a third modification. The EUV light transmission system 6 according to the present modification differs from the EUV light transmission system 6 according to the first embodiment only in the configuration of the cancellation mechanism 70.

In the present modification, the cancellation mechanism 70 is configured by a spring 80. One end of the spring 80 is fixed to the lower portion 63d of the mirror holder 63 via a spring fixing member 81, and the other end thereof is fixed to the EUV light transmission chamber 2b via a spring fixing member 82. In the present modification, the drive port 2h is not formed in the EUV light transmission chamber 2b.

The spring 80 is arranged such that the direction of the generated load Ps is coaxial with the direction of the load Pa applied to the cover member 67. The spring 80 applies the load Ps in the +Z direction to the lower portion 63d of the mirror holder 63. The load Ps propagates via the support column 64 to the cover member 67. As the spring 80, a spring that generates the load Ps having a magnitude to cancel the load Pa is selected.

4.3.2 Operation

In the present modification, the mirror holder 63 is moved by driving the stage mechanism 62 based on the control signal Sc transmitted from the EUV light generation processor 12a. The spring 80 elastically deforms as the mirror holder 63 moves.

As in the first embodiment, even when the cover member 67 is moved, the load Pa and the load Ps are canceled as being equal in magnitude and opposite in direction.

4.3.3 Effect

According to the stage mechanism 62, even when the cover member 67 is moved, the load Pa is canceled by the load Ps, and therefore, as in the first embodiment, an inexpensive and compact stage can be adopted as the stage mechanism 62.

In the present modification, the tilt stage described in the first modification or the second modification may be used as the stage mechanism 62.

4.4 Fourth Modification 4.4.1 Configuration

Figure 11:
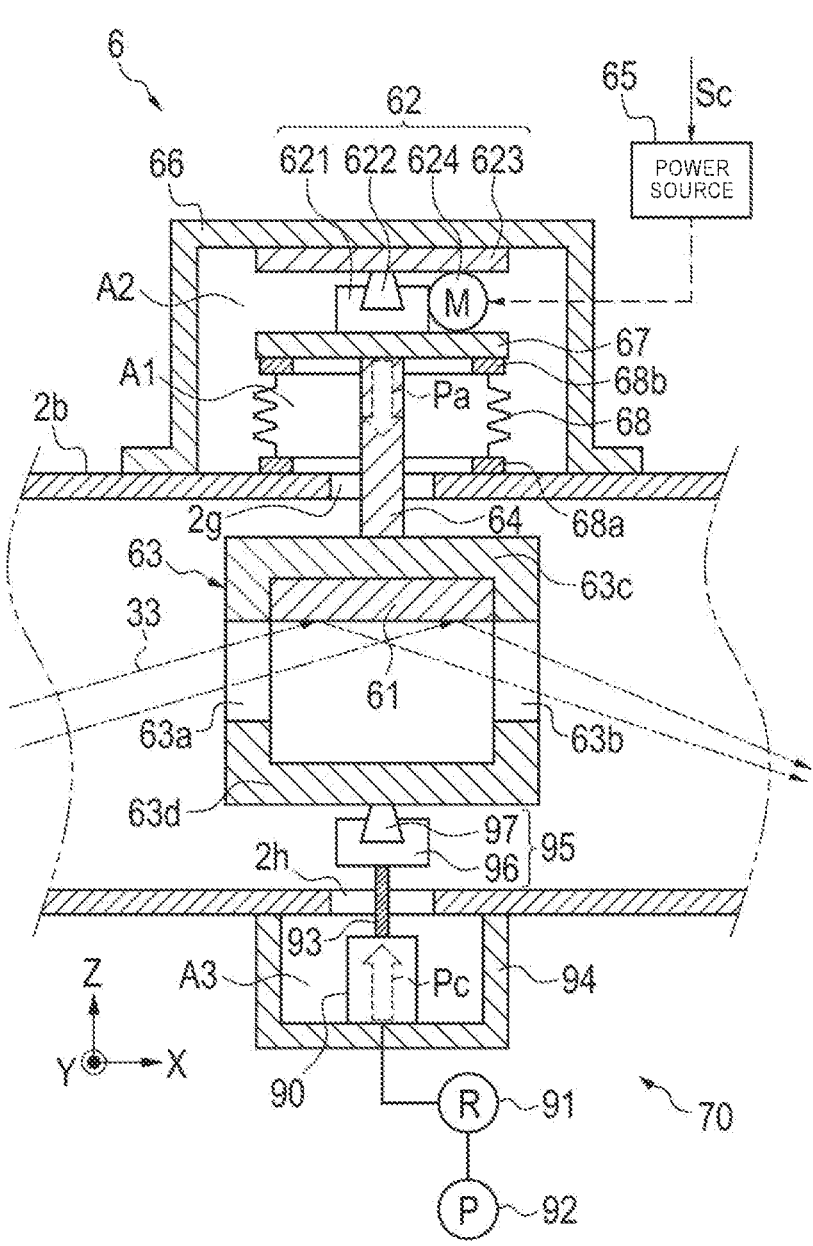
FIG. 11 is a diagram showing the configuration of the EUV light transmission system according to a fourth modification.

FIG. 11 shows the configuration of the EUV light transmission system 6 according to a fourth modification. The EUV light transmission system 6 according to the present modification differs from the EUV light transmission system 6 according to the first embodiment only in the configuration of the cancellation mechanism 70.

In the present modification, the cancellation mechanism 70 is configured to include a cylinder 90. The cylinder 90 generates a load Pc for canceling the load Pa applied to the cover member 67. For example, the cylinder 90 is an air cylinder. The cylinder 90 is connected to the pump 92 via a regulator 91.

The cylinder 90 has a cylinder rod 93. The cylinder rod 93 is inserted to the drive port 2h. The diameter of the drive port 2h is larger than the diameter of the cylinder rod 93.

On the outer surface of the EUV light transmission chamber 2b, a box-shaped cylinder fixing member 94 is arranged around the drive port 2h so as to surround the drive port 2h. The cylinder 90 is stored in a cylinder space A3 formed by the cylinder fixing member 94, and is fixed to the cylinder fixing member 94.

The cylinder rod 93 is connected to the lower portion 63d of the mirror holder 63 via a stage mechanism 95. The stage mechanism 95 is an XY stage including a rail guide 96 and a rail 97. The rail guide 96 and the rail 97 have a similar configuration to the rail guide 621 and the rail 622 included in the stage mechanism 62. The stage mechanism 95 is arranged to allow the mirror holder 63 to move in the XY plane with respect to the cylinder 90.

When the cylinder 90 pushes out the cylinder rod 93, the mirror holder 63 receives the load Pc in the +Z direction. The pushing force of the cylinder rod 93 is adjusted by the regulator 91 so as to generate the load Pc having a magnitude that cancels the load Pa applied to the cover member 67.

4.4.2 Operation

In the present modification, the mirror holder 63 is moved by driving the stage mechanism 62 based on the control signal Sc transmitted from the EUV light generation processor 12a. The stage mechanism 95 moves following the mirror holder 63.

As in the first embodiment, even when the cover member 67 is moved, the load Pa and the load Pc are canceled as being equal in magnitude and opposite in direction.

4.4.3 Effect

According to the stage mechanism 62, even when the cover member 67 is moved, the load Pa is canceled by the load Pc, and therefore, as in the first embodiment, an inexpensive and compact stage can be adopted as the stage mechanism 62.

In the present modification, the tilt stage described in the first modification or the second modification may be used as the stage mechanism 62. In this case, a floating joint may be arranged between the stage mechanism 95 and the lower portion 63d of the mirror holder 63.

4.5 Fifth Modification

A fifth modification shows an example in which, instead of the EUV light transmission system 6, an EUV light detection system 6a for detecting the state of the EUV light 33 is arranged at the EUV light transmission chamber 2b.

Figure 12:
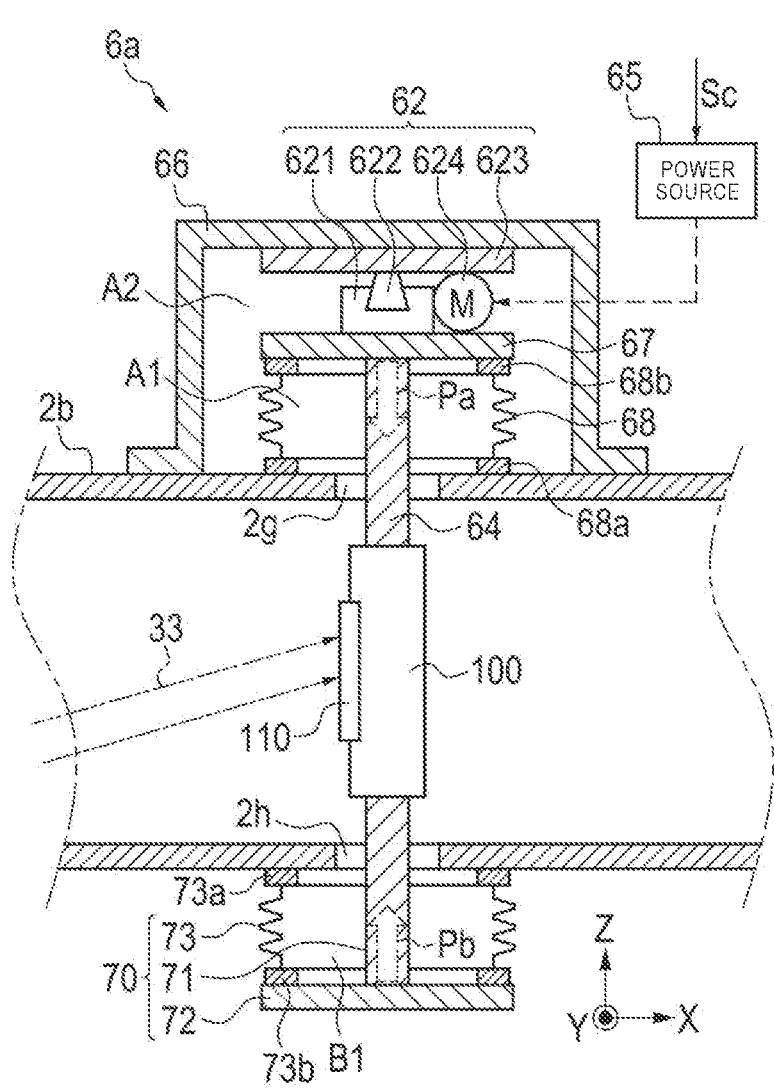
FIG. 12 is a diagram showing the configuration of the EUV light transmission system according to a fifth modification.

FIG. 12 shows the configuration of the EUV light detection system 6a according to the fifth modification. The EUV light detection system 6a differs from the configuration of the EUV light transmission system 6 according to the first embodiment only in including the detector holder 100 instead of the mirror holder 63.

The detector holder 100 is fixed between the support column 64 and the support column 71. The detector holder 100 holds a detector 110 that detects the EUV light 33 at a position where the EUV light 33 enters. The detector 110 is a camera or a sensor.

The state of the EUV light 33 can be detected with high accuracy by using the EUV light detection system 6a. Further, as in the first embodiment, an inexpensive and compact stage can be adopted as the stage mechanism 62.

The stage mechanism 62 and the cancellation mechanism 70 of the EUV light detection system 6a can be modified in a similar manner to the first to fourth modifications.

The mirror 61 and the detector 110 are examples of the "optical elements" according to the present disclosure. Further, the mirror holder 63 and the detector holder 100 are examples of the "holders" according to the present disclosure.

4.6 Other Modification

In the first embodiment, although the stage mechanism 62 is the XY stage, it is possible to adopt instead a stage in which the XY stage is combined with the tilt stage described in the first modification or the second modification. In this case, in addition to moving the cover member 67 in the X direction and the Y direction, the stage mechanism 62 can tilt the cover member 67 with the X axis and the Y axis as rotation axes, respectively. Further, the stage mechanism 62 may be a single-axis linear stage, a single-axis tilt stage, or a combination thereof.

5. Others

Figure 13:
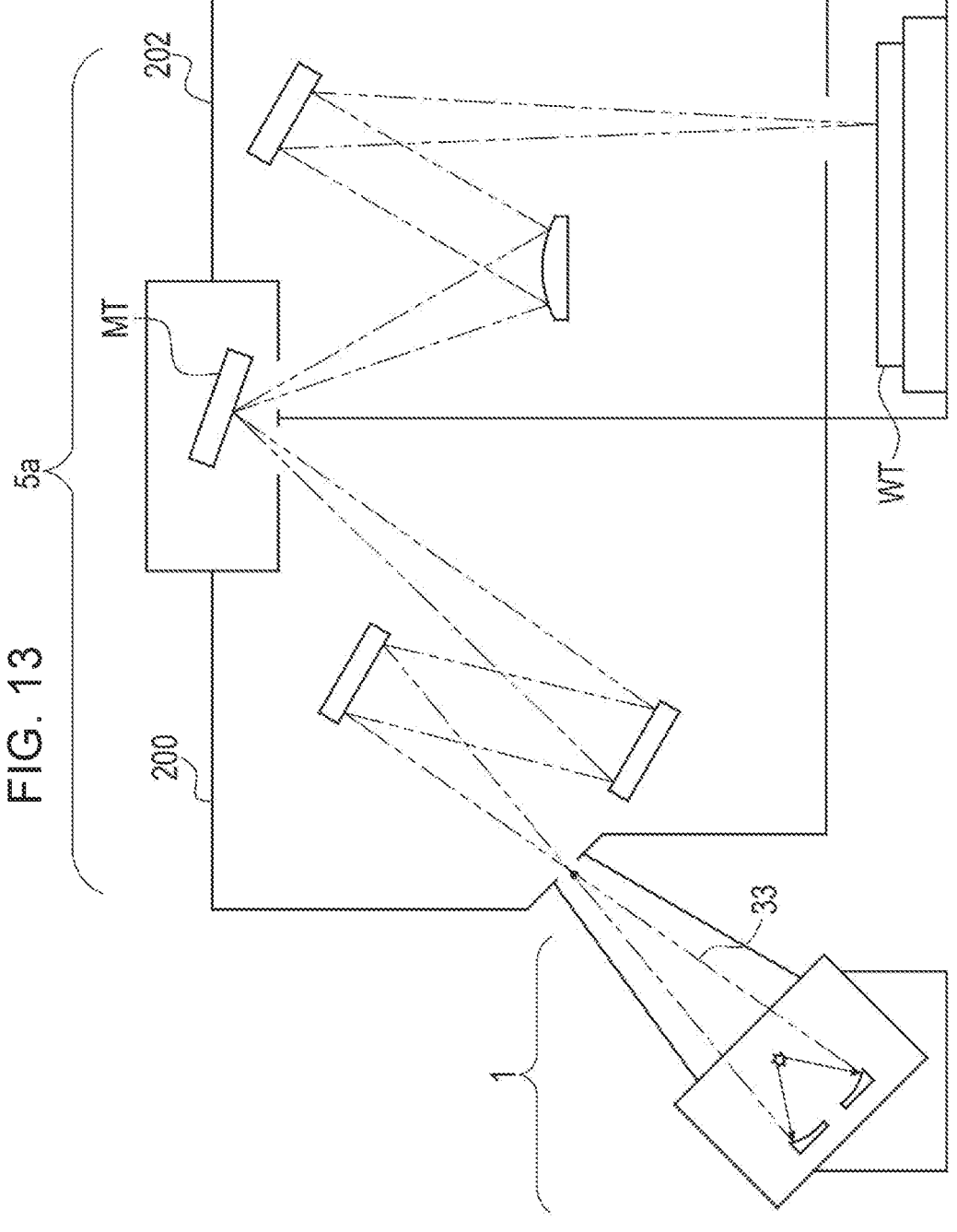
FIG. 13 is a diagram schematically showing the configuration of an exposure apparatus connected to the EUV light generation apparatus.

FIG. 13 schematically shows the configuration of an exposure apparatus 5a connected to the EUV light generation apparatus 1. In FIG. 13, the exposure apparatus 5a as the external apparatus 5 includes a mask irradiation unit 200 and a workpiece irradiation unit 202. The mask irradiation unit 200 irradiates a mask pattern on a mask table MT via a reflection optical system with the EUV light 33 incident from the EUV light generation apparatus 1. The workpiece irradiation unit 202 images the EUV light 33 reflected by the mask table MT onto a workpiece (not shown) placed on the workpiece table WT via a reflection optical system. The workpiece is a photosensitive substrate such as a semiconductor wafer on which photoresist is applied. The exposure apparatus 5a synchronously translates the mask table MT and the workpiece table WT to expose the workpiece to the EUV light 33 reflecting the mask pattern. Through the exposure process as described above, a device pattern is transferred onto the semiconductor wafer, thereby an electronic device can be manufactured.

Figure 14:
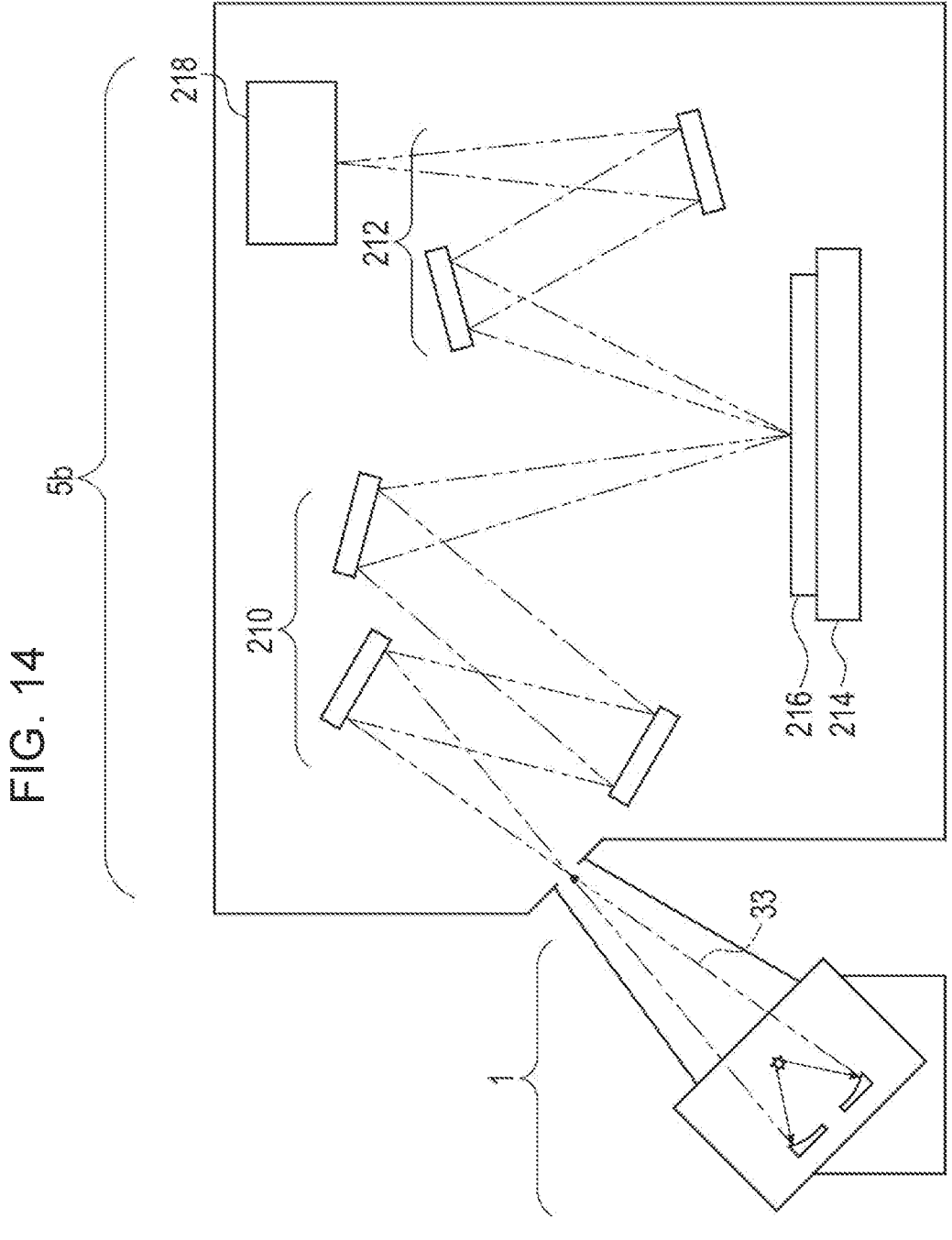
FIG. 14 is a diagram schematically showing the configuration of an inspection apparatus connected to the EUV light generation apparatus.

FIG. 14 schematically shows the configuration of an inspection apparatus 5b connected to the EUV light generation apparatus 1. In FIG. 14, the inspection apparatus 5b as the external apparatus 5 includes an illumination optical system 210 and a detection optical system 212. The EUV light generation apparatus 1 outputs, as a light source for inspection, the EUV light 33 to the inspection apparatus 5b. The illumination optical system 210 reflects the EUV light 33 incident from the EUV light generation apparatus 1 to illuminate a mask 216 placed on a mask stage 214. Here, the mask 216 conceptually includes a mask blanks before a pattern is formed. The detection optical system 212 reflects the EUV light 33 from the illuminated mask 216 and forms an image on a light receiving surface of a detector 218. The detector 218 having received the EUV light 33 obtains an image of the mask 216. The detector 218 is, for example, a time delay integration (TDI) camera. A defect of the mask 216 is inspected based on the image of the mask 216 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 5a.

The description above is intended to be illustrative and the present disclosure is not limited thereto. Therefore, it would be obvious to those skilled in the art that various modifications to the embodiments of the present disclosure would be possible without departing from the spirit and the scope of the appended claims.

The terms used throughout the present specification and the appended claims should be interpreted as non-limiting terms. For example, terms such as "comprise". "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A. B, and C.

What is claimed is:

1. An EUV light generation apparatus, comprising:

a chamber having internal pressure maintained below atmospheric pressure and being capable of generating EUV light by irradiating a target in droplet form with laser light inside the chamber;

a first bellows pipe having one end thereof connected to the chamber to communicate with inside of the chamber;

a first cover member which seals the other end of the first bellows pipe under atmospheric pressure;

a holder connected to the first cover member and arranged inside the chamber in a state of holding an optical element on which the EUV light is to be incident;

a stage mechanism connected to the first cover member outside the chamber and configured to change an angle of the optical element with respect to the EUV light by tilting the first cover member with a rotation center located on a surface of the optical element as a rotation axis;

a fixing member which fixes the stage mechanism to the chamber; and a cancellation mechanism which is arranged at a position facing the first cover member via the holder, connected to the holder to be movable in accordance with change of the angle of the optical element, and transmits, to the holder, a second load in a direction opposite to a direction of a first load applied to the first cover member due to pressure difference between atmospheric pressure and pressure inside the chamber.

2. The EUV light generation apparatus according to claim 1, wherein the optical element is a mirror which reflects the EUV light.

3. The EUV light generation apparatus according to claim 2, wherein the holder is a box-shaped member in which a first opening and a second opening are formed, the mirror is arranged inside the holder, the EUV light is incident on the mirror through the first opening, and the EUV light reflected by the mirror is output through the second opening.

4. The EUV light generation apparatus according to claim 1, wherein the optical element is a detector configured to detect the EUV light.

5. The EUV light generation apparatus according to claim 1, wherein the cancellation mechanism includes a second bellows pipe having one end thereof connected to the chamber to communicate with inside of the chamber, and a second cover member which seals the other end of the second bellows pipe under atmospheric pressure, and transmits, to the holder, the second load applied to the second cover member due to pressure difference.

6. The EUV light generation apparatus according to claim 5, wherein the first cover member is connected to the holder via a first support column, and the second cover member is connected to the holder via a second support column.

7. The EUV light generation apparatus according to claim 6, wherein the first support column and the second support column are arranged coaxially.

8. The EUV light generation apparatus according to claim 5, wherein the first cover member and the second cover member have the same area respectively on the sides facing inside of the chamber.

9. The EUV light generation apparatus according to claim 1, wherein the cancellation mechanism includes a spring which generates the second load.

10. The EUV light generation apparatus according to claim 1, wherein the cancellation mechanism includes a cylinder which generates the second load.

11. The EUV light generation apparatus according to claim 1, wherein the stage mechanism is configured to tilt the first cover member by swinging the first cover member.

12. An electronic device manufacturing method, comprising:

generating EUV light using an EUV light generation apparatus;

outputting the EUV light to an exposure apparatus; and exposing a photosensitive substrate to the EUV light in the exposure apparatus to manufacture an electronic device, the EUV light generation apparatus including:

a chamber having internal pressure maintained below atmospheric pressure and being capable of generating the EUV light by irradiating a target in droplet form with laser light inside the chamber;

a first bellows pipe having one end thereof connected to the chamber to communicate with inside of the chamber;

a first cover member which seals the other end of the first bellows pipe under atmospheric pressure;

a holder connected to the first cover member and arranged inside the chamber in a state of holding an optical element on which the EUV light is to be incident;

a stage mechanism connected to the first cover member outside the chamber and configured to change an angle of the optical element with respect to the EUV light by tilting the first cover member with a rotation center located on a surface of the optical element as a rotation axis;

a fixing member which fixes the stage mechanism to the chamber; and a cancellation mechanism which is arranged at a position facing the first cover member via the holder, connected to the holder to be movable in accordance with change of the angle of the optical element, and transmits, to the holder, a second load in a direction opposite to a direction of a first load applied to the first cover member due to pressure difference between atmospheric pressure and pressure inside the chamber.

13. The electronic device manufacturing method according to claim 12, wherein the stage mechanism is configured to tilt the first cover member by swinging the first cover member.

14. An electronic device manufacturing method, comprising:

inspecting a defect of a mask by irradiating the mask with EUV light generated using an EUV light generation apparatus;

selecting a mask using a result of the inspection; and exposing and transferring a pattern formed on the selected mask onto a photosensitive substrate, the EUV light generation apparatus including:

a chamber having internal pressure maintained below atmospheric pressure and being capable of generating the EUV light by irradiating a target in droplet form with laser light inside the chamber;

a first bellows pipe having one end thereof connected to the chamber to communicate with inside of the chamber;

a first cover member which seals the other end of the first bellows pipe under atmospheric pressure;

a holder connected to the first cover member and arranged inside the chamber in a state of holding an optical element on which the EUV light is to be incident;

a stage mechanism connected to the first cover member outside the chamber and configured to change an angle of the optical element with respect to the EUV light by tilting the first cover member with a rotation center located on a surface of the optical element as a rotation axis;

a fixing member which fixes the stage mechanism to the chamber; and a cancellation mechanism which is arranged at a position facing the first cover member via the holder, connected to the holder to be movable in accordance with change of the angle of the optical element, and transmits, to the holder, a second load in a direction opposite to a direction of a first load applied to the first cover member due to pressure difference between atmospheric pressure and pressure inside the chamber.

15. The electronic device manufacturing method according to claim 14, wherein the stage mechanism is configured to tilt the first cover member by swinging the first cover member.

\* \* \* \* \*